United States Patent
Lou et al.

(10) Patent No.: US 9,885,746 B2
(45) Date of Patent: Feb. 6, 2018

(54) SWITCHING MATRIX AND TESTING SYSTEM FOR SEMICONDUCTOR CHARACTERISTIC MEASUREMENT USING THE SAME

(75) Inventors: Choon Leong Lou, Hsinchu (TW); Li Min Wang, Hsinchu (TW)

(73) Assignee: STAR TECHNOLOGIES, INC., Hsinchu (TW)

(*) Notice: Subject to any disclaimer, the term of this patent is extended or adjusted under 35 U.S.C. 154(b) by 112 days.

(21) Appl. No.: 13/425,987

(22) Filed: Mar. 21, 2012

(65) Prior Publication Data
US 2013/0082731 A1  Apr. 4, 2013

(30) Foreign Application Priority Data

Oct. 3, 2011 (TW) ............... 100135703 A

(51) Int. Cl.
*G01R 31/28* (2006.01)
(52) U.S. Cl.
CPC ............... *G01R 31/2844* (2013.01)
(58) Field of Classification Search
CPC ...... G01R 1/20; G01R 31/2844; H01H 67/22; H04Q 3/52; H04Q 3/68; H01L 22/00
USPC .... 324/762.01, 537, 500, 126, 322, 658, 74, 324/750.01, 754.03; 361/783; 703/13; 307/112, 39, 762.01, 126, 322, 658, 74, 307/750.1, 754.03
See application file for complete search history.

(56) References Cited

U.S. PATENT DOCUMENTS

| | | | |
|---|---|---|---|
| 5,124,638 A * | 6/1992 | Winroth | G01R 31/2834 324/73.1 |
| 5,375,075 A * | 12/1994 | Ogata et al. | 702/119 |
| 5,559,482 A | 9/1996 | Close et al. | |
| 5,898,557 A | 4/1999 | Baba et al. | |
| 6,069,484 A * | 5/2000 | Sobolewski et al. | 324/750.01 |
| 6,100,815 A * | 8/2000 | Pailthorp | H01C 17/242 324/754.07 |
| 6,487,456 B1 * | 11/2002 | Masano et al. | 700/11 |
| 6,791,344 B2 * | 9/2004 | Cook | G01R 31/2844 324/754.05 |
| 7,236,084 B2 * | 6/2007 | McCormack et al. | 340/2.28 |
| 8,378,672 B2 * | 2/2013 | Bidenbach et al. | 324/251 |

(Continued)

FOREIGN PATENT DOCUMENTS

| | | |
|---|---|---|
| JP | 1998-51944 | 2/1998 |
| JP | 2005338017 | 12/2005 |
| JP | 2010-210608 | 9/2010 |

OTHER PUBLICATIONS

Office Action dated Oct. 10, 2013 from the Japanese counterpart application 2012-073004.

(Continued)

*Primary Examiner* — Melissa Koval
*Assistant Examiner* — Nasima Monsur
(74) *Attorney, Agent, or Firm* — Juan Carlos A. Marquez; Marquez IP Law Office, PLLC

(57) ABSTRACT

A switching matrix includes a plurality of input ports, a plurality of output ports, a plurality of switching devices configured to open and close, an electrical connection between the input ports and the output ports, and an electrical sensor configured to generate a signal by measuring a predetermined electrical property of the electrical connection, the open and close of switching devices is pre-determined by status read from the electrical sensor.

23 Claims, 3 Drawing Sheets

(56) References Cited

U.S. PATENT DOCUMENTS

| | | | |
|---|---|---|---|
| 2003/0193051 A1* | 10/2003 | Beech | 257/48 |
| 2004/0008052 A1* | 1/2004 | Sakaguchi | G09G 3/006 324/762.01 |
| 2005/0030043 A1* | 2/2005 | Ker et al. | 324/456 |
| 2006/0114243 A1* | 6/2006 | Iwasaki | G01R 31/2844 345/173 |
| 2007/0065808 A1* | 3/2007 | Bohm | B01L 3/502761 435/4 |
| 2007/0146000 A1* | 6/2007 | Oshima | 324/765 |
| 2008/0164898 A1* | 7/2008 | Bae et al. | 324/758 |
| 2010/0013503 A1* | 1/2010 | Huebner | G01R 31/31926 324/757.03 |
| 2010/0164528 A1* | 7/2010 | Rahman | G01R 35/005 324/762.01 |
| 2010/0231254 A1* | 9/2010 | Lou | H03K 17/002 324/756.03 |
| 2011/0187376 A1* | 8/2011 | Barrenscheen | G01R 31/327 324/416 |
| 2012/0242357 A1* | 9/2012 | Eccles | 324/750.01 |

OTHER PUBLICATIONS

English abstract translation for Office Action dated Oct. 10, 2013 from the Japanese counterpart application 2012-073004.

JP2010-210608 listed above has a counterpart publication of US2010/0231254A1.

JP1998-51944 listed above has a counterpart patent of U.S. Pat. No. 5,898,557A.

Office Action dated Jun. 3, 2013 from Korea counterpart application 10-2012-0025016.

English abstract translation for Office Action dated Jun. 3, 2013 from Korea counterpart application 10-2012-0025016.

English abstract translation for JP2005338017 which is also published as US2006-0114243.

* cited by examiner

SWITCHING MATRIX AND TESTING SYSTEM FOR SEMICONDUCTOR CHARACTERISTIC MEASUREMENT USING THE SAME

BACKGROUND OF THE INVENTION

1. Technical Field

The present invention relates to a switching matrix and a testing system for semiconductor characteristic measurement using the same, and more particularly, to a switching matrix for semiconductor characteristic measurement and a testing system incorporating sensor and controller to control the turn-on and/or turn-off operation of the switch matrix.

2. Background

Generally, it is necessary to test the electrical characteristics of semiconductor device such as the integrated circuit devices at the wafer level to check whether the integrated circuit device meets the product functional and break down specifications. Integrated circuit devices with electrical characteristics meeting the specifications are selected for the subsequent packaging process, while other devices are discarded to avoid additional packaging cost. Other full functional electrical tests are performed on the integrated circuit device after the packaging process is completed, so as to screen out substandard devices and guarantee product quality.

Electronic instrumentations comprising different types and quantity of measurement resources are used to test and analyze the performance of devices and circuits on the wafer. A plurality of test leads from the measurement resources are connected to selected points within the device or circuit on the wafer in order to perform the desired tests. Conventionally, a customized or generic switching matrix or multiplexer is used to easily change the connections between test instruments and multiple or single device under test (DUT). The switching matrix is configured to connect input ports to output ports in arbitrary combinations in accordance with an instruction from a user. At wafer-level, depending on the electric properties being measured, one or more test instruments are connected to the input ports, a probe card is connected to the output ports, and the target DUT is connected to the probe card. The input ports and the output ports are connected via relay switches that build up the connection path within the matrix or multiplexer, and the electrical connections between the input ports and the output ports are opened or closed by the relay switches. The above description is also applicable to package-level test in which devices or circuits are tested with the use of sockets on printed circuit board that link it to the instruments directly or via a matrix and/or multiplexer. U.S. Pat. Nos. 6,069,484, 5,124, 638, 5,559,482, 6,791,344, and U.S. Pat. No. 6,100,815 disclose the application of the switching matrix to the testing of the integrated circuit devices.

SUMMARY

One aspect of the present invention provides a switching matrix incorporating a controlling module configured to control the turn-on and turn-off of the switch, and a testing system for semiconductor devices using the same.

A switching matrix according to this aspect of the present invention comprises a switching array and an electrical sensor. The switching array includes a plurality of input ports, a plurality of output ports, a plurality of switching devices configured to open and close an electrical connection between the input ports and the output ports. The electrical sensor configured to generate a signal by measuring a predetermined electrical property of the electrical connection.

Another aspect of the present invention provides a testing system for semiconductor devices comprising a switching matrix and a controller coupling with the switching matrix. In one embodiment of the present invention, the switching matrix comprises a single or plurality of input ports configured to couple with a measurement instrument, a single or plurality of output ports configured to couple with a probing device, a single or plurality of switching devices configured to open and close an electrical connection between any of the input ports and any of the output ports, and an electrical sensor configured to generate a signal by measuring a predetermined electrical property of the electrical connection. In one embodiment of the present invention, the controller is configured to control (disable or enable) the operation of the switching device by taking into consideration the signal from the electrical sensor.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed might be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

The objectives and advantages of the present invention will become apparent upon reading the following description and upon reference to the accompanying drawings, in which.

DETAILED DESCRIPTION

Figure 1:
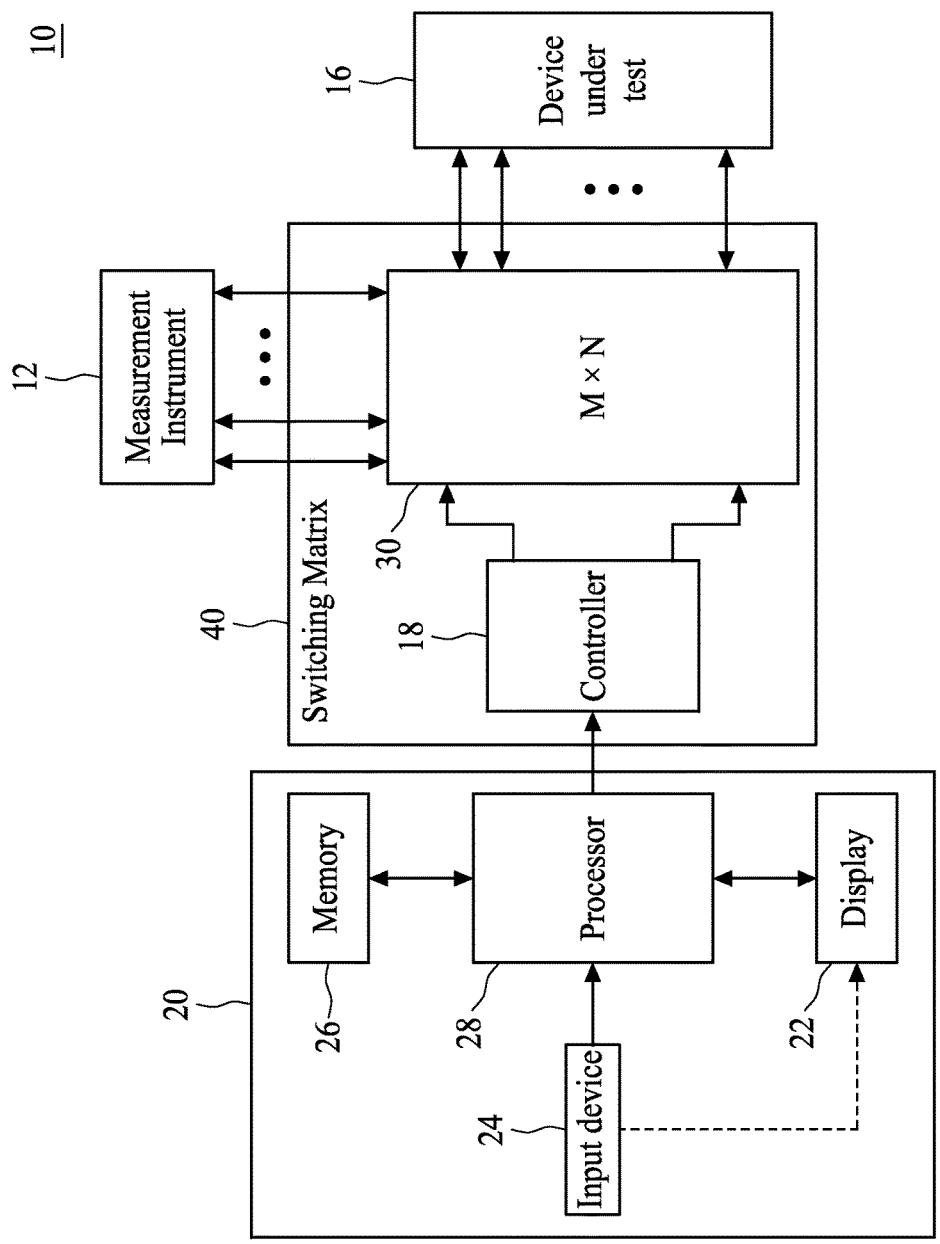
FIG. 1 illustrates a testing system for semiconductor characteristic measurement according to one embodiment of the present invention.

FIG. 1 illustrates a testing system 10 for semiconductor characteristic measurement according to one embodiment of the present invention. The testing system 10 comprises a measurement instrument 12, a switching matrix 40, a device under test 16 such as the integrated circuit device, and an computer controller 20. The switching array 40 includes a switching array 30 and a controller 18. The measurement instruments 12 may include a power supply and a sensor such as current and voltage sources, or digital signals to bias the device under test and with current meter, voltmeter, oscilloscope, digitizer, etc. for measuring the electrical properties of the device under test 16. The switching matrix 40 may include a plurality of contacts configured to contact the pads of the device under test 16. The operation system 20 includes a display 22, an input device 24, a memory 26 and a processor 28, which is configured to control the operation of the display 22, the input device 24, the memory 26, and peripherals.

Figure 2:
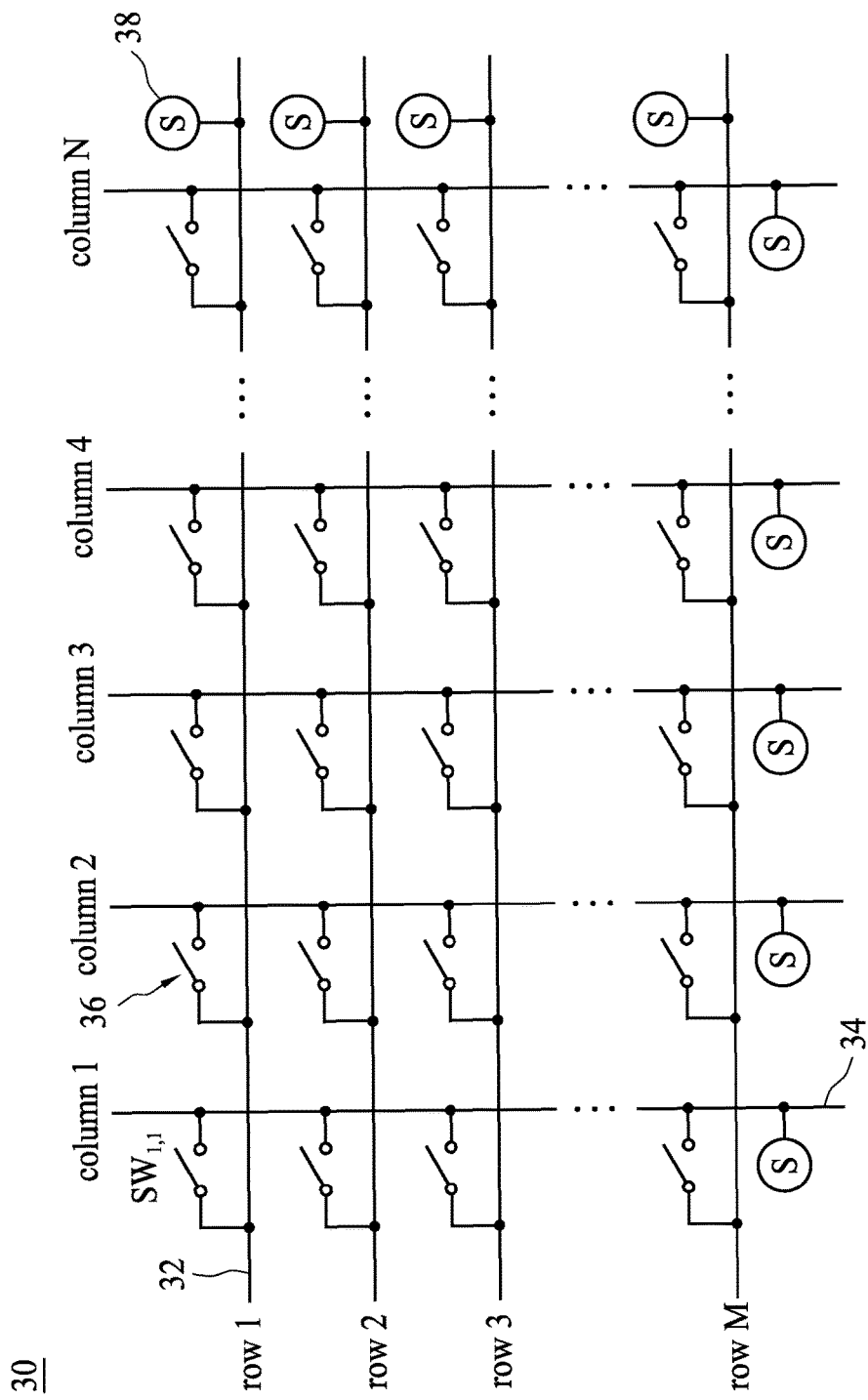
FIG. 2 illustrates a switching matrix according to one embodiment of the present invention.

FIG. 2 illustrates the switching array 30 in FIG. 1 according to one embodiment of the present invention. The switching array 30 includes N row ports and M column ports, and M and N can be any integers equal to or larger than 1. The row ports 1 to M are connected to corresponding row wires 32, and the column ports 1 to N are connected to corresponding column wires 34. The switching array 30 further includes a plurality of switching devices 36 ($SW_{i,j}$) arranged in an array manner and configured to open and close an electrical connection between the input ports and the output ports, wherein each switching device $SW_{i,j}$ connects one row wire 32 and one column wire 34, and the first suffix indicates the connected row wire and the second suffix indicates the connected column wire. When the switching device $SW_{1,1}$ is in a closed state (turned on), the row port 1 is electrically connected to the column port 1; when the switching device $SW_{1,1}$ is in an open state (turned off), the row port 1 is not electrically connected to the column port 1. The switching devices 36 ($SW_{i,j}$) can be implemented by a single relay switch or a multi-in-multi-out device of A×B configuration, wherein A and B are of can be any integers equal to or larger than 1.

The controller 18 is configured to control the on/off state of the switching devices 36 ($SW_{i,j}$) according to the changing instruction of the processor 28. In one embodiment of the present invention, the switching array 30 further includes a plurality of electrical sensors 38 (voltage sensor or current sensor) configured to generate a signal by measuring a predetermined electrical property of the electrical connection. In one embodiment of the present invention, the electrical sensor 38 is connected to the row wire 32 and/or the column wire 34. In one embodiment of the present invention, the controller 18 is incorporated inside the switching array 30. The controller 18 can over-ride the instruction from the processor based on the sensor signal read back from the switch matrix.

In one embodiment of the present invention, the row ports and column ports can serve as input ports coupling with the measurement instrument 12 or output ports coupling with the device under test 16. The row ports can alternatively serve as output ports of the switching array 30, while the column ports can serve as input ports. The test signal is generated by one of the sourcing or measurement instrument 12 in the testing system 10 and transmitted to the device under test 16 via the switching array 30. The electrical signal of the device under test 16 is transmitted back to the measurement instruments 12 via the switching array 30, i.e., the switching array 30 is a bi-directional device.

In a manual or automatic testing system such as that shown in FIG. 1 and FIG. 2, the switching array 30 may be damaged while it switches with high voltage, high current, and/or high power applied thereto. The damage to the relay switches 36 can occur whenever the applied voltage, current and/or power is higher than the specification of the relay switches 36 in used.

Figure 3:
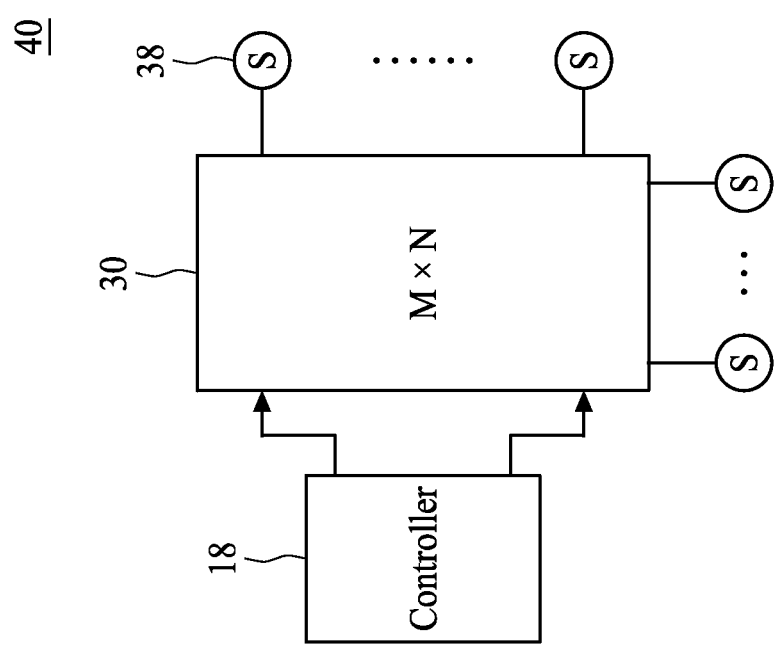
FIG. 3 illustrates a "super" switching matrix encompassing the switching array illustrated in FIG. 2 and a controller to enable and disable the turn-off and turn-on of the switches within the switching matrix.

FIG. 3 illustrates the "smart matrix" 40, which include the M×N switching array 30 and the switch controller 18. To prevent damage to the relay switches 36 and switch array 30, one embodiment, the sensor 38, of the present invention can measures the applied voltage, current, and/or power on the electrical connection to the input relay switches 36, or from the output relay switches. In one embodiment of the present invention, after receiving the changing instruction of the processor 28, the controller 18 is configured to control the turn-on operation of the switching device 36 by taking into consideration the signal from the electrical sensor 38. The input port and the output port can only be turn-on or turn-off based on the controller status which enable or disable the switching of the relay switches 36 before changing the switch status, so as to prevent the relay switches 36 from being damaged by the applied voltage, current or power which eventually damage the switch array 30.

Although the present invention and its advantages have been described in detail, it should be understood that various changes, substitutions and alterations can be made herein without departing from the spirit and scope of the invention as defined by the appended claims. For example, many of the processes discussed above can be implemented using different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A switching matrix for semiconductor charscteristic measurement, comprising:
   a switching array, including:
   at least one input port;
   at least one output port to electrically connect with a device under test;
   at least one switching device electrically connecting between the at least one input port and the at least one output port, wherein an electrical connection between one of the at least one input port and one of the at least one output port is closed when one of the at least one switching device electrically connecting there between is turned on, and the electrical connection between said input and output ports is open when said switching device is turned off;
   at least one electrical sensor electrically connecting with the at least one switching device, and, during a testing operation for testing an electrical property of the device under test, generating a signal in response to measuring a predetermined electrical property of the electrical connection between the one of the at least one input port and the one of the at least one output port; and
   a controller configured to, during the testing operation for testing the electrical property of the device under test, not change a conduction state of the at least one switching device when the measurement from the at least one electrical sensor indicates that the predetermined electrical property is greater than a reference electrical property, and change a conduction state of the at least one switching device when the measurement from the at least one electrical sensor indicates that the predetermined electrical property is less than the reference electrical property.

2. The switching matrix for semiconductor characteristic measurement of claim 1, wherein the at least one electrical sensor is at least one voltage sensor.

3. The switching matrix for semiconductor characteristic measurement of claim 1, wherein the at least one electrical sensor is at least one current sensor.

4. The switching matrix for semiconductor characteristic measurement of claim 1, wherein the at least one electrical sensor is at least one power sensor.

5. The switching matrix for semiconductor characteristic measurement of claim 1, wherein the at least one electrical sensor is at least one combination of voltage, current and/or power sensor.

6. The switching matrix for semiconductor characteristic measurement of claim 1, wherein the electrical connection between the one of the at least one input port and the one of the at least one output port comprises an input wire connecting a respective one of the at least one input port to the switching device.

7. The switching matrix for semiconductor characteristic measurement of claim 6, wherein the at least one electrical sensor is connected to the input wire of the at least one switching device.

8. The switching matrix for semiconductor characteristic measurement of claim 1, wherein the electrical connection between the one of the at least one input port and the one of the at least one output port comprises an output wire connecting a respective one of the at least one output port to the switching device.

9. The switching matrix for semiconductor characteristic measurement of claim 8, wherein the at least one electrical sensor is connected to the output wire of the at least one switching device.

10. The switching matrix for semiconductor characteristic measureument of claim 1, wherein the at least one sensor is not within the switching array.

11. The switching matrix for semiconductor characteristic measurement of claim 1, wherein the controller is programmed to control the operation of the at least one switching device in response to the signal and a changing instruction of the at least one switching device from a processor.

12. The switching matrix for semiconductor characteristic measurement of claim 1, wherein the number of the at least one switching device is plural, and the plurality of switching devices is arranged in an array manner.

13. The switching matrix for semiconductor characteristic measurement of claim 11, wherein the controller is programmed to override the changing instruction from the processor based on the signal.

14. A testing system for semiconductor characteristic measurement, comprising:
a switching matrix comprising:
a plurality of input ports coupled with a measurement instrument;
a plurality of output ports electrically connected with a device under test and coupled with a probing device to measure a semiconductor;
a plurality of switching devices electrically connecting between the plurality of input ports and the plurality of output ports, wherein an electrical connection between one of the plurality of input ports and one of the plurality of output ports is closed when one of the plurality of switching devices electrically connecting therebetween is turned on, and the electrical connection between said input and output ports is open when said one of the plurality of switching devices is turned off; and
an electrical sensor electrically connecting with the plurality of switching devices, and generating a signal in response to measuring a predetermined electrical property applied on of the electrical connection between the one of the plurality of input ports and the one of the plurality of output ports; and
a controller configured to, during a testing operation for testing electrical properties of the device under test, not change a conduction state of the one of the plurality of switching devices in response to the measurement from the at least one electrical sensor indicating that the predetermined electrical property is greater than a reference electrical property, and to change a conduction state of the one of the plurality of switching devices in response to the measurement from the at least one electrical sensor indicating that the predetermined electrical property is less than the reference electrical property.

15. The switching matrix for semiconductor characteristic measurement of claim 14, wherein the electrical sensor is a voltage sensor, a current sensor, or a power sensor.

16. The testing system for semiconductor characteristic measurement of claim 14, further comprising a measurement instrument programmed to measure the electrical property of the device under test.

17. The testing system for semiconductor characteristic measurement of claim 14, wherein the electrical connection between the one of the plurality of input ports and the one of the plurality of output ports comprises an input wire connecting a respective one of the plurality of input ports to the plurality of switching devices.

18. The testing system for semiconductor characteristic measurement of claim 17, wherein the electrical sensor is connected to the input wire.

19. The testing system for semiconductor characteristic measurement of claim 14, wherein the electrical connection between the one of the plurality of input ports and the one of the plurality of output ports comprises an output wire connecting a respective one of the plurality of output ports to the switching device.

20. The testing system for semiconductor characteristic measurement of claim 19, wherein the electrical sensor is connected to the output wire.

21. The testing system for semiconductor characteristic measruement of claim 14, wherein the plurality of switching devices are arranged in an array manner.

22. The testing system for semiconductor characteristic measurement of claim 14, further comprising a processor programmed to send a changing instruction of the plurality of switching devices to the controller, wherein the controller is programmed to control the operation of the plurality of switching devices in response to the signal and the changing instruction from the processor.

23. The testing system for semiconductor characteristic measurement of claim 22, wherein the controller is programmed to override the changing instruction from the processor based on the signal.

* * * * *